(12) United States Patent
Li et al.

(10) Patent No.: US 10,256,363 B2
(45) Date of Patent: Apr. 9, 2019

(54) SURFACE TREATMENT FOR PHOTOVOLTAIC DEVICE

(71) Applicant: INTERNATIONAL BUSINESS MACHINES CORPORATION, Armonk, NY (US)

(72) Inventors: Ning Li, White Plains, NY (US); Devendra K. Sadana, Pleasantville, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/792,943

(22) Filed: Oct. 25, 2017

(65) Prior Publication Data

US 2018/0062023 A1 Mar. 1, 2018

Related U.S. Application Data

(62) Division of application No. 14/697,695, filed on Apr. 28, 2015, now Pat. No. 9,929,305.

(51) Int. Cl.
*H01L 31/044* (2014.01)
*H01L 31/18* (2006.01)
*H01L 31/0747* (2012.01)

(52) U.S. Cl.
CPC ...... *H01L 31/1868* (2013.01); *H01L 31/0747* (2013.01); *Y02E 10/50* (2013.01); *Y02P 70/521* (2015.11)

(58) Field of Classification Search
CPC ........ H01L 31/00–31/078; Y02E 10/50–10/60

USPC .................................................. 136/243–265
See application file for complete search history.

(56) References Cited

U.S. PATENT DOCUMENTS

| | | | |
|---|---|---|---|
| 4,945,065 A | 7/1990 | Gregory et al. | |
| 6,674,095 B1 | 1/2004 | Watanabe | |
| 6,787,385 B2 | 9/2004 | Barber et al. | |
| 7,955,510 B2 | 6/2011 | Arghavani et al. | |
| 8,637,411 B2 | 1/2014 | Swaminathan et al. | |
| 8,691,618 B2 | 4/2014 | Lee | |
| 8,871,560 B2 | 10/2014 | Ahmed et al. | |

(Continued)

OTHER PUBLICATIONS

Carpenter et al., "Effects of Na2S and (NH4) 2S edge passivation treatments on the dark current-voltage characteristics of GaAs pn diodes," Applied Physics Letters, vol. 52, No. 25, 1988, pp. 2157-2159.

(Continued)

*Primary Examiner* — Bach T Dinh
(74) *Attorney, Agent, or Firm* — L. Jeffrey Kelly

(57) ABSTRACT

The present invention relates generally to semiconductor devices and more particularly, to a structure and method of forming a photovoltaic cell using a surface treatment to improve device performance. Embodiments of the present invention may improve open circuit voltage, fill factor, and energy conversion efficiency by performing a surface treatment on an upper surface of an absorber layer. The surface treatment may improve device performance by permitting a more cohesive interface between the upper surface of the absorber layer and a lower surface of a passivation layer. The more cohesive interface may allow carriers to move from one layer to another with less resistance, and thus, increase device performance.

20 Claims, 9 Drawing Sheets

(56) References Cited

U.S. PATENT DOCUMENTS

| | | | |
|---|---|---|---|
| 2009/0211627 A1* | 8/2009 | Meier | H01L 31/068 136/255 |
| 2011/0189815 A1 | 8/2011 | Sager et al. | |
| 2012/0132277 A1 | 5/2012 | Sulima et al. | |
| 2012/0264309 A1* | 10/2012 | Barnett | H01L 21/306 438/758 |
| 2012/0285518 A1 | 11/2012 | De Souza et al. | |
| 2015/0125987 A1 | 5/2015 | Buffiere et al. | |
| 2016/0322515 A1 | 11/2016 | Li et al. | |

OTHER PUBLICATIONS

Pastuszka et al., "Preparation and performance of transmission-mode GaAs photocathodes as sources for cold dc electron beams," Journal of Applied Physics, vol. 88, No. 11, 2000, pp. 6788-6800.

Yamamoto et al., "Thermal emittance measurements for electron beams produced from bulk and superlattice negative electron affinity photocathodes," Journal of Applied Physics, vol. 102, No. 2, 2007, 024904, 6 pages.

IBM: List of IBM Patents or Patent Applications Treated as Related (Appendix P), Jan. 3, 2018, 2 pages.

* cited by examiner

| 610 | 508 | 306 | 204 | 102 |

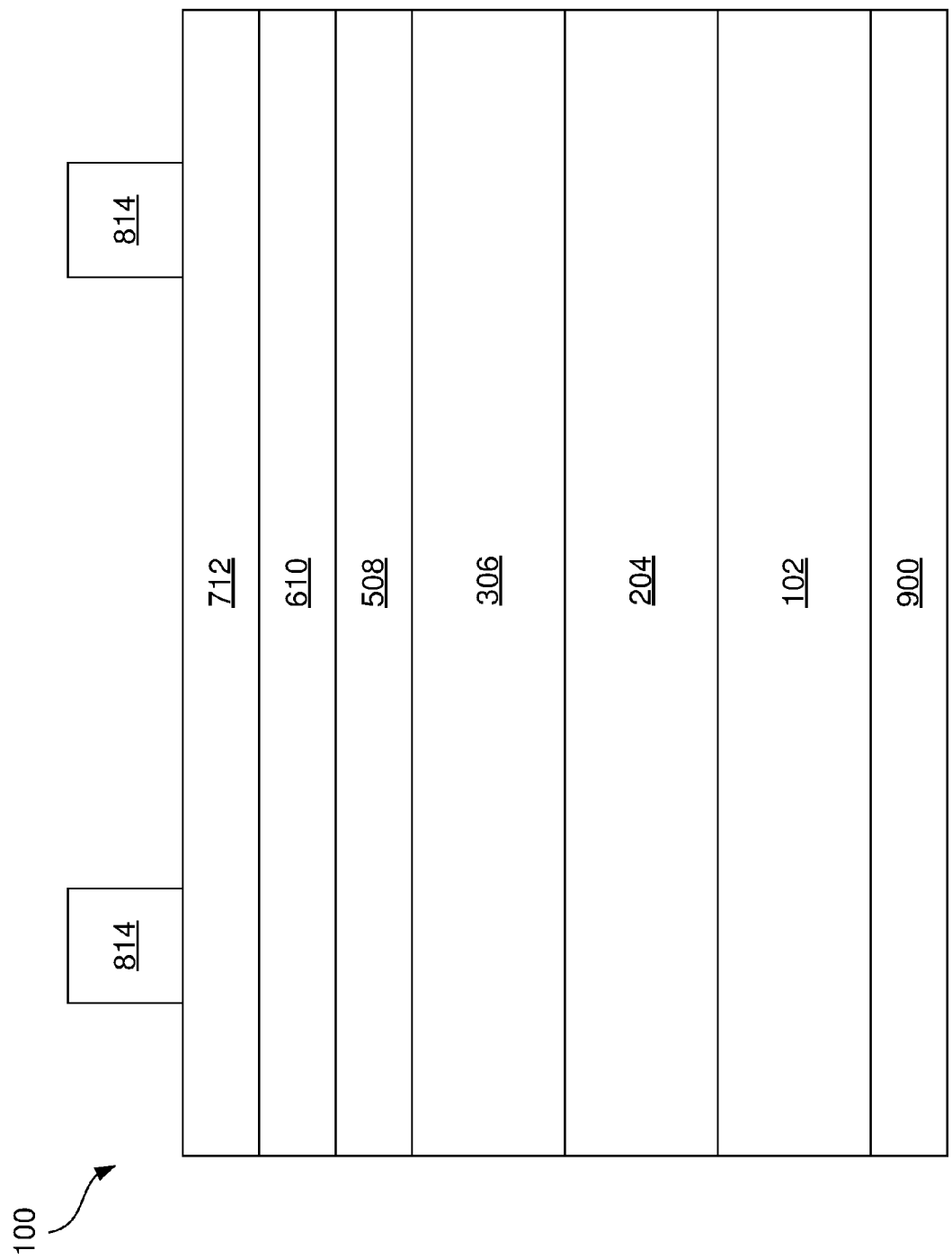

SURFACE TREATMENT FOR PHOTOVOLTAIC DEVICE

BACKGROUND

The present invention relates generally to semiconductor devices and more particularly, to a structure and method of forming a photovoltaic cell using a surface treatment to improve device performance.

Electricity generated from photovoltaic cells may not be in grid parity with other electric generating units in many parts of the United States. To achieve widespread grid parity, substantial reductions in cost and improvements in performance may need to be achieved. Cost reductions may be achieved through innovative photovoltaic cell fabrication techniques. Performance improvements may be achieved by improving efficiency, which may be accomplished by improving short circuit current, fill factor, and open circuit voltage.

In a photovoltaic cell, surface level pinning may exist at a junction between layers due to a high surface state density. Surface level pinning may limit open circuit voltage and reduce fill factor in a photovoltaic cell. Overcoming strong surface Fermi level pinning may increase open circuit voltage and fill factor in a photovoltaic device, thus increasing device efficiency. However, overcoming strong surface Fermi level pinning may be challenging.

SUMMARY

According to an embodiment, a method is disclosed. The method may include: performing a hydrogen fluoride cleaning process on the surface of the absorber layer; performing an ammonium sulfide passivation process on the surface of the absorber layer; and performing a plasma surface treatment on the surface of the absorber layer, exposing the surface of the absorber layer to a plasma, wherein the plasma transforms into a solid state forming a thin solid layer on the surface of the absorber layer.

According to an embodiment, another method is disclosed. The method may include: forming a back surface layer on an upper surface of a substrate; forming an absorber layer on an upper surface of the back surface layer; performing a surface treatment on an upper surface of the absorber layer, the surface treatment comprising a hydrogen fluoride cleaning process, an ammonium sulfide passivation process, and a plasma surface treatment, wherein the plasma surface treatment exposes the upper surface of the absorber layer to a plasma; forming a passivation layer on the upper surface of the absorber layer; forming an emitter layer on an upper surface of the passivation layer; forming a transparent electrode layer on an upper surface of the emitter layer; forming a front contact layer on an upper surface of the transparent electrode layer; and forming a back contact layer on a bottom surface of the substrate.

According to an embodiment, a structure is disclosed. The structure may include: a back surface layer on an upper surface of a substrate; an absorber layer on an upper surface of the back surface layer; a sulfur monolayer on an upper surface of the absorber layer; a thin solid layer on an upper surface of the absorber layer; a passivation layer on the upper surface of the absorber layer; an emitter layer on the upper surface of the passivation layer; a transparent electrode layer on an upper surface of the emitter layer; a front contact layer on an upper surface of the transparent electrode layer; and a back contact layer on a bottom surface of the substrate.

BRIEF DESCRIPTION OF THE SEVERAL VIEWS OF THE DRAWINGS

The following detailed description, given by way of example and not intended to limit the invention solely thereto, will best be appreciated in conjunction with the accompanying drawings, in which not all structures may be shown.

FIG. 6 is a cross section view illustrating forming an emitter layer, according to an embodiment of the present invention.

FIG. 9 is a cross section view illustrating forming a back contact layer, according to an embodiment of the present invention.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
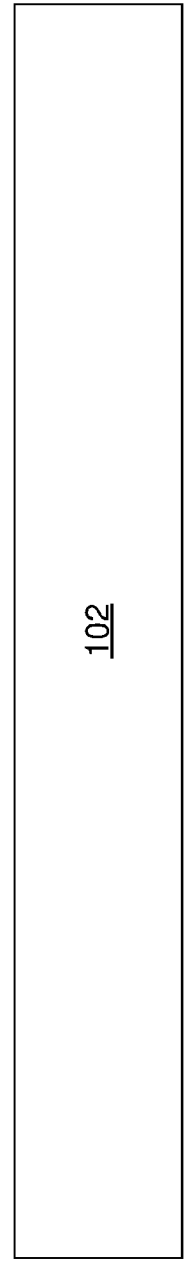
FIG. 1 is a cross section view illustrating a structure comprising a substrate, according to an embodiment of the present invention.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. Rather, these exemplary embodiments are provided so that this disclosure will be thorough and complete and will fully convey the scope of this invention to those skilled in the art.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element such as a layer, region, or substrate is referred to as being "on", "over", "beneath", "below", or "under" another element, it may be present on or below the other element or intervening elements may also be present. In contrast, when an element is referred to as being "directly on", "directly over", "directly beneath", "directly below", or "directly contacting" another element, there may be no intervening elements present. Furthermore, the terminology used herein is for the purpose of describing particular embodiments only and is not intended to be limiting of the invention. As used herein, the singular forms "a," "an," and "the" are intended to include the plural forms as well, unless the context clearly indicates otherwise.

For the purposes of the description hereinafter, the terms "solar cell", "photovoltaic cell", and derivatives thereof shall relate generally to a device that converts light energy to electrical energy by the photovoltaic effect. Solar cells may include a semiconductor material that absorbs photons from light. When photons are absorbed, valance band electrons present in the semiconductor material may become excited, jump to the conduction band, and become free. The free electrons may then diffuse through the semiconductor material. Some of the free electrons may reach a junction where they are accelerated into a different material, typically a metal contact, by a built-in potential. This movement generates an electromotive force, thus converting some of the light energy into electric energy.

For the purposes of the description hereinafter, the term "back" and derivatives thereof shall relate generally to an element such as a layer, region, or substrate near a back contact layer. In contrast, the term "front" and derivatives thereof shall relate generally to an element, region, or substrate near a front contact layer.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

Embodiments of the present invention relate generally to semiconductor devices and more particularly, to a structure and method of forming a photovoltaic cell. Specifically, embodiments of the present invention may relate to a solar cell which may be fabricated using a surface treatment process on an upper surface of an absorber layer to increase device performance.

Device performance may be described with parameters like open circuit voltage, short circuit voltage, fill factor, and energy conversion efficiency. Open circuit voltage is a difference of electrical potential energy between two terminals of a device when no external electrical current flows between the two terminals. Short circuit voltage is a difference of electrical potential energy between two terminals of a device when external current is flowing between the two terminals. A fill factor is a ratio of actual maximum obtainable power to a product of open circuit voltage and short circuit voltage. Energy conversion efficiency is a ratio between electrical energy output and solar energy input. A single crystal III-V semiconductor heterostructure with an intrinsic thin layer (HIT) cell may have a low open current voltage due to surface Fermi level pinning. Strong surface Fermi level pinning may be produced by a high surface state density. A method to reduce surface state density is needed to increase performance.

Embodiments of the present invention may improve open circuit voltage, fill factor, and energy conversion efficiency by performing a surface treatment on the upper surface of the absorber layer. The absorber layer of the HIT cell may be a single crystal III-V semiconductor. The surface treatment may include a hydrogen fluoride cleaning process, an ammonium sulfide passivation process, and a plasma surface treatment. The surface treatment may improve device performance by permitting a more cohesive interface between the upper surface of the absorber layer and a lower surface of a passivation layer. The more cohesive interface may allow carriers to move from one layer to another with less resistance, and thus, increase device performance.

Methods of forming a photovoltaic cell and treating a surface of an absorber layer to improve on-current voltage and fill factor are described below with reference to FIGS. 1-9.

Referring now to FIG. 1, a cross section view illustrating a structure 100 comprising the substrate 102 is shown. The substrate 102 may be composed of a substance that yields a high open-circuit voltage and may enable a substantially defect free junction to be formed between itself and a back surface field layer formed in steps discussed below. In an embodiment, the substrate 102 may include any known bulk semiconductor or layered semiconductor such as Si/SiGe, a silicon-on-insulator (SOI), or a SiGe-on-insulator (SGOI). Examples of bulk semiconductor substrate materials may include undoped Si, n-doped Si, p-doped Si, single crystal Si, polycrystalline Si, amorphous Si, Ge, SiGe, SiC, SiGeC, Ga, GaAs, InAs, InP and all other III/V or II/VI compound semiconductors. Nonlimiting examples of III/V semiconductors include gallium arsenide, aluminum gallium arsenide, amorphous silicon, or any combination thereof. In a preferred embodiment, the substrate 102 may be composed of gallium arsenide. The substrate 102 may enable the solar cell to operate at higher voltages if composed of a wide bandgap III-V semiconductor material than if composed of a narrower bandgap material like amorphous silicon. The substrate 102 may be formed using a conventional epitaxial deposition process known in the art, such as, for example, rapid thermal chemical vapor deposition (RTCVD), low-energy plasma deposition (LEPD), ultra-high vacuum chemical vapor deposition (UHVCVD), atmospheric pressure chemical vapor deposition (APCVD), or molecular beam epitaxy (MBE). In an embodiment, the substrate 102 may be formed independently. In another embodiment, the substrate 102, the back surface field layer 204, and the absorber layer 306 may be formed in a continuous epitaxial process.

Figure 2:
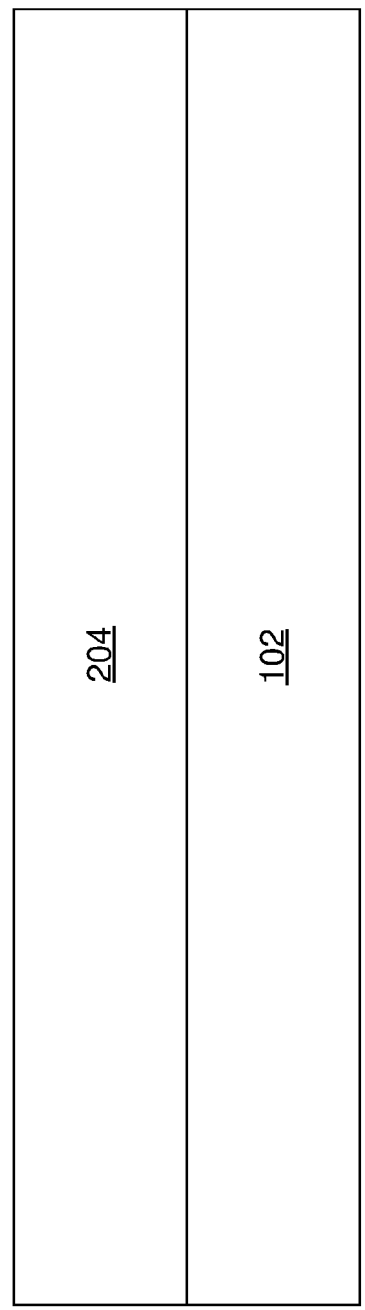
FIG. 2 is a cross section view illustrating forming a back surface field layer, according to an embodiment of the present invention.

Referring now to FIG. 2, a cross section view illustrating forming the back surface field layer 204 on an upper surface of the substrate 102 is shown. The back surface field layer 204 may reduce carrier recombination at a back surface of a solar cell. In an embodiment, the back surface field layer 204 may reduce carrier recombination by repelling electrons from the back surface and attracting holes to the back surface. In an embodiment, the back surface field layer 204 may be composed of a semiconductor material, such as, for example, indium gallium phosphide. In an embodiment, the back surface field layer 204 may contain a p-type doping agent, such as, for example, boron, aluminum, gallium, or a combination thereof. The back surface field layer 204 may be formed using a conventional epitaxial deposition process known in the art, such as, for example, RTCVD, LEPD, UHVCVD, APCVD, or MBE. The back surface field layer 204 may have a thickness ranging from approximately 35 nm to approximately 65 nm.

Figure 3:
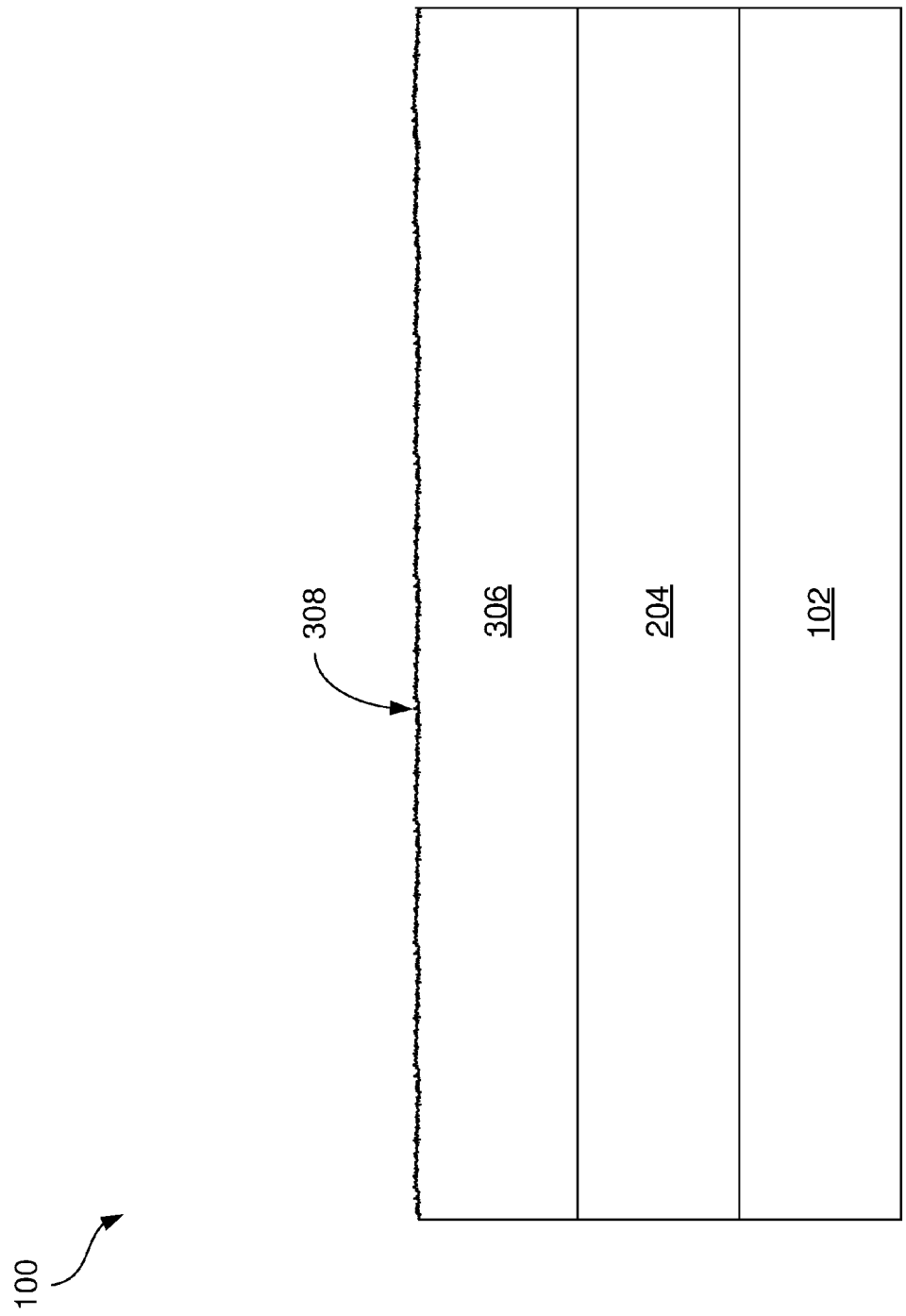
FIG. 3 is a cross section view illustrating forming an absorber layer, according to an embodiment of the present invention.

Referring now to FIG. 3, a cross section view illustrating forming an absorber layer 306 on the back surface layer 204 is shown. In an embodiment, the absorber layer 306 may be composed of a semiconductor material, such as, for example, gallium arsenide, aluminum gallium arsenide, amorphous silicon, or any combination thereof. In a preferred embodiment, the absorber layer 306 may be composed of gallium arsenide. The absorber layer 306 may contain a p-type doping agent, such as, for example, boron, aluminum, gallium, or a combination thereof. The absorber layer 306 may have lighter doping than the back surface field layer 204. The absorber layer 306 may be formed using a conventional epitaxial deposition process known in the art, such as, for example, RTCVD, LEPD, UHVCVD, APCVD, or MBE. In an embodiment, the absorber layer 306 may have a thickness ranging from approximately 2 micrometers to approximately 4 micrometers, and ranges therebetween. The upper surface of the absorber layer 306 may have impurities, such as, for example, embedded oxides and elemental arsenic. The upper surface of the absorber layer 306 may have dangling bonds which may result in a high surface state density. A high surface state density on the upper surface of the absorber layer 306 may reduce solar cell performance. However, as described below with reference to FIG. 4, a surface treatment may be performed on an upper surface of the absorber layer 306 to improve solar cell performance.

In some embodiments, as described with reference to FIGS. 1-3, the substrate 102, the back surface field layer 204, and the absorber layer 306 may be formed in a single deposition process. In other embodiments, as described with reference to FIGS. 1-3, the substrate 102, the back surface field layer 204, and the absorber layer 306 may each be formed in separate deposition processes.

Figure 4:
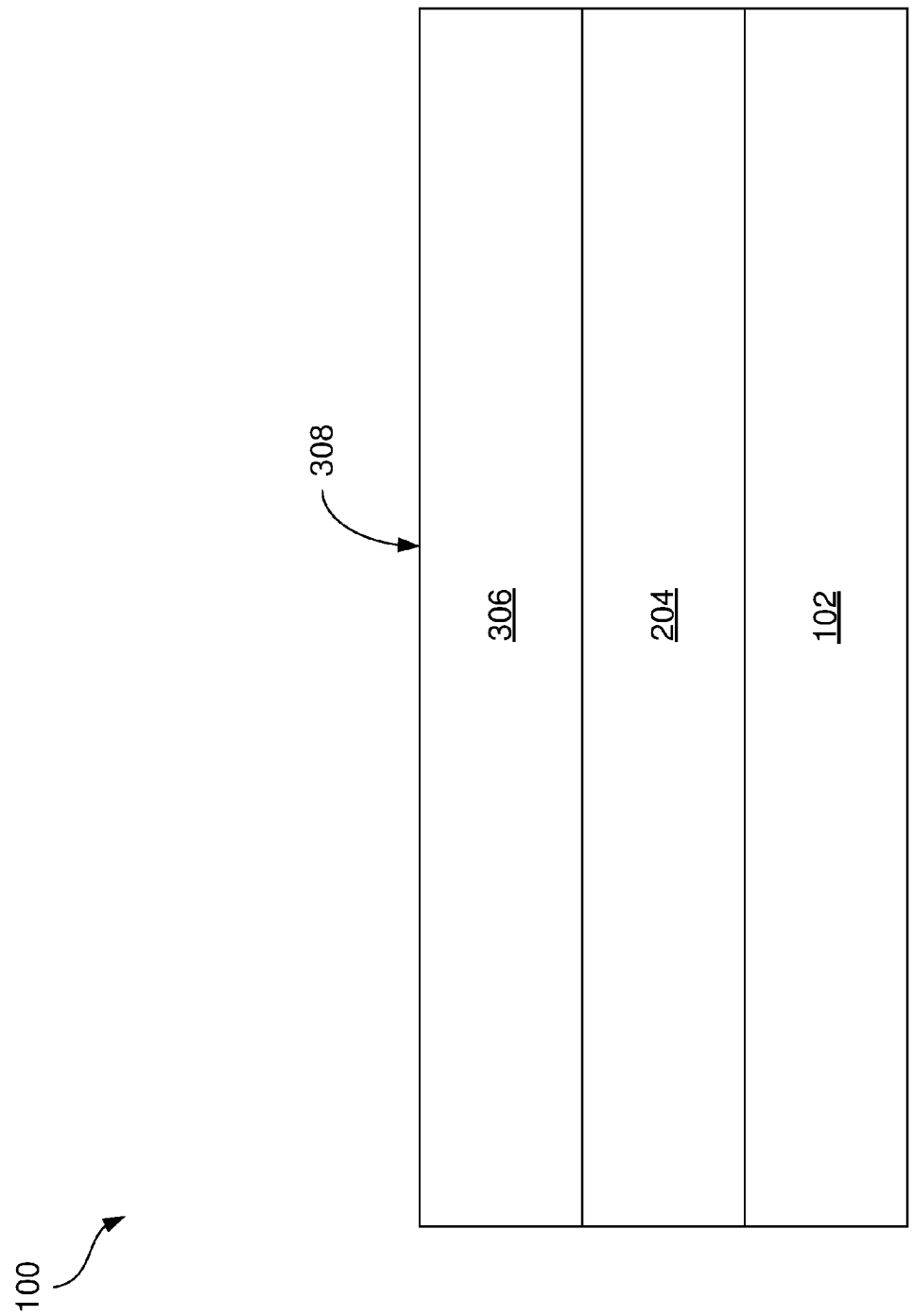
FIG. 4 is a cross section view illustrating performing a surface treatment on an upper surface of the absorber layer, according to an embodiment of the present invention.

Referring now to FIG. 4, a cross section view illustrating an upper surface 308 of the absorber layer 306 after a surface treatment is shown. In an embodiment, the surface treatment may include a hydrogen fluoride cleaning process, an ammonium sulfide passivation process, a plasma surface treatment, or any combination thereof. In a preferred embodiment, the hydrogen fluoride cleaning process may be performed before the ammonium sulfide passivation process. The hydrogen fluoride cleaning process may be performed on the upper surface 308 of the absorber layer 306. The hydrogen fluoride cleaning process may remove impurities, such as, for example, embedded oxides and elemental arsenic, from the upper surface 308 of the absorber layer 306. In an embodiment, an ammonium sulfide passivation process may be performed on the upper surface 308 of the absorber layer 306. The ammonium sulfide passivation process may be used to remove impurities, such as, for example, embedded oxides and elemental arsenic, from the upper surface 308 of the absorber layer 306. The ammonium sulfide passivation process may create a sulfur monolayer (not shown) on the upper surface 308. The sulfur monolayer on the upper surface 308 may protect the upper surface 308 from obtaining additional impurities. The sulfur monolayer on the upper surface 308 may be substantially monatomic. The ammonium sulfide passivation process may terminate dangling bonds at the upper surface 308 of the absorber layer 306. By terminating dangling bonds, the surface state density on the upper surface 308 of the absorber layer 306 may be substantially decreased. A decrease in surface state density may reduce surface level pinning. By reducing surface level pinning, surface recombination velocity may also decrease, resulting in increased open circuit voltage. A combination of hydrogen fluoride cleaning and ammonium sulfide passivation may result in an improvement in open circuit voltage ranging from approximately a half bandgap to approximately a full bandgap voltage.

In a preferred embodiment, a plasma surface treatment may be performed on the upper surface 308 of the absorber layer 306 after the hydrogen sulfide cleaning process and the ammonium sulfide passivation process. The plasma surface treatment may be performed without exposing the upper surface 308 to air. The plasma surface treatment may be performed by plasma enhanced chemical vapor deposition (PECVD). The plasma surface treatment may involve exposing the upper surface 308 to one or more plasmas. The one or more plasmas may be transformed to a solid state on the upper surface 308 and form a thin solid layer on the upper surface 308. The solid thin layer may include material originating from the one or more plasmas. The one or more plasmas exposed to the upper surface 308 may include, for example, phosphine, hydrogen, nitrogen trifluoride, or any combination thereof. In an embodiment, the plasma surface treatment may involve exposing the upper surface 308 of the absorber layer 306 to phosphine, hydrogen, and nitrogen trifluoride. The plasma surface treatment involving phosphine, hydrogen, and nitrogen trifluoride may improve fill factor up to approximately 85%. Utilizing the hydrogen fluoride cleaning process, the ammonium sulfide passivation process, and the plasma surface treatment may improve power conversion efficiency.

In an embodiment, the plasma surface treatment may be performed without the hydrogen sulfide cleaning process or the ammonium sulfide passivation process. In another embodiment, the plasma surface treatment may be performed before the ammonium sulfide passivation process. In another embodiment, the plasma surface treatment may be performed before the hydrogen sulfide cleaning process.

Figure 5:
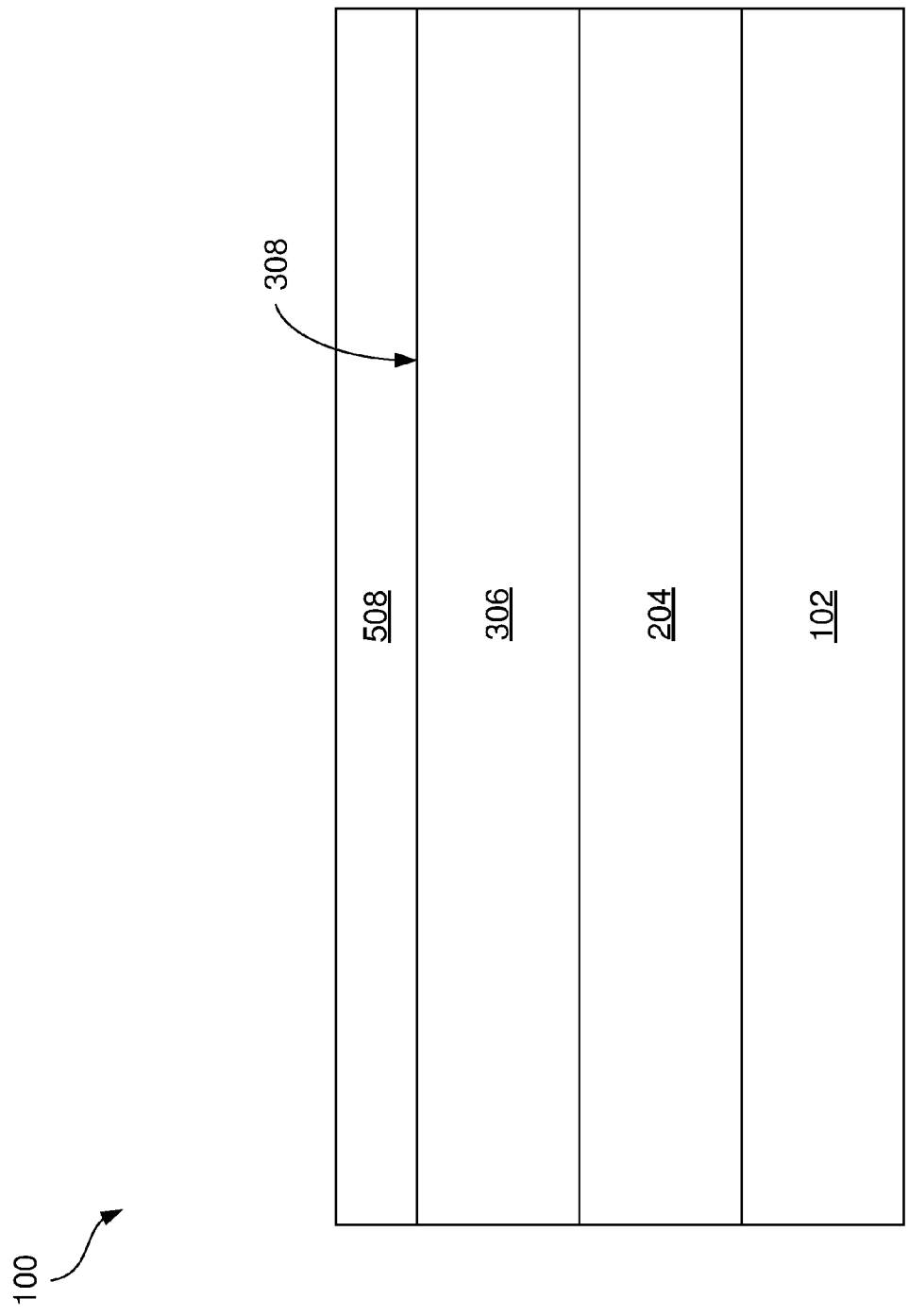
FIG. 5 is a cross section view illustrating forming a passivation layer, according to an embodiment of the present invention.
Figure 8:
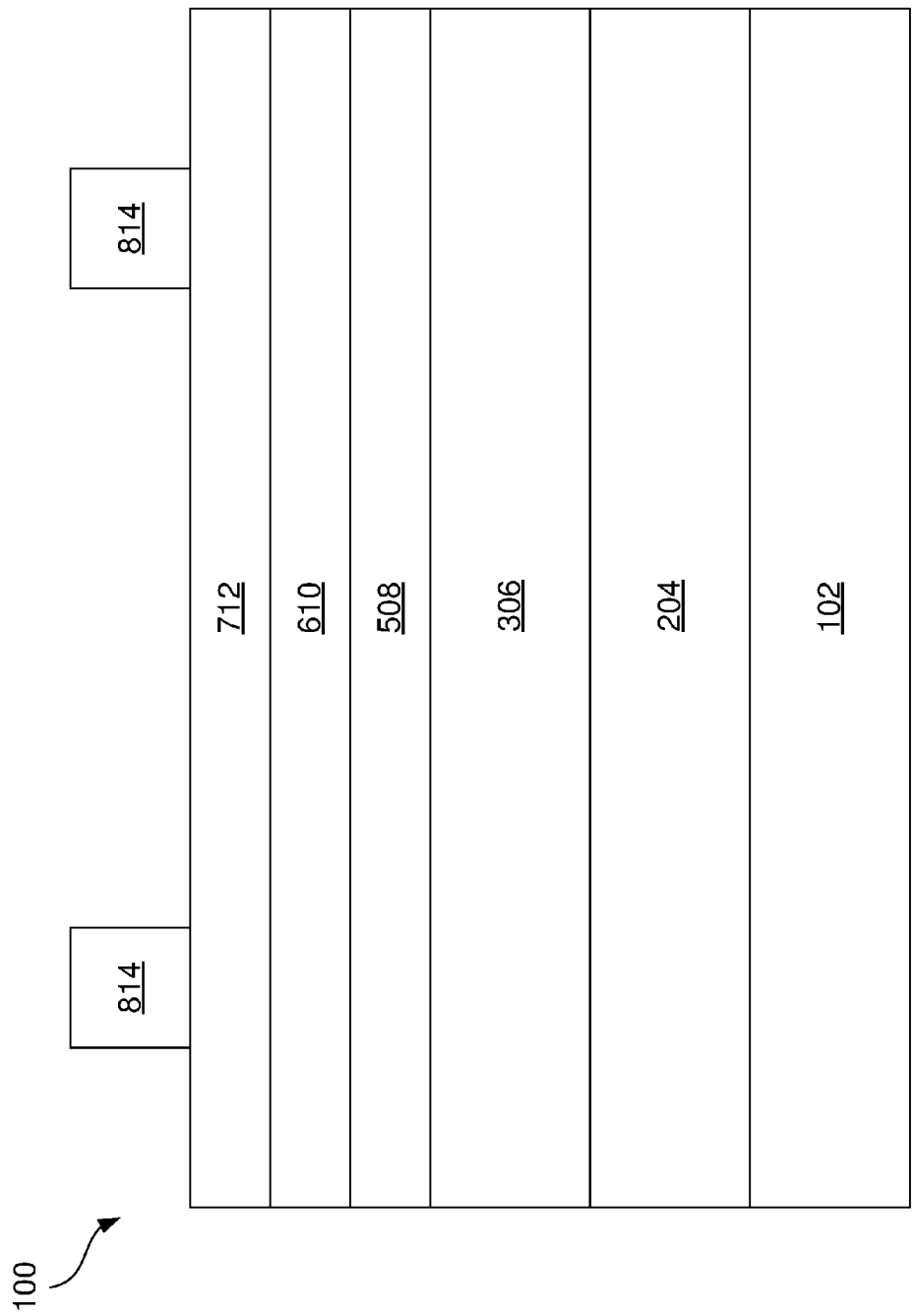
FIG. 8 is a cross section view illustrating forming a front contact layer, according to an embodiment of the present invention.

Referring now to FIG. 5, a cross section view illustrating forming a passivation layer 508 on the upper surface 308 of the absorber layer 306 is shown. The passivation layer 508 may also be referred to as an intrinsic thin layer. The passivation layer (i.e. intrinsic thin layer) may be a significant feature in a HIT solar cell. The passivation layer 508 may reduce carrier recombination at a front surface of a solar cell by reducing junction defects. In an embodiment, a reduction of junction defects may allow electrons to flow more freely out of the absorber layer 306 and toward an front contact layer 814 (FIG. 8). In an embodiment, the passivation layer 508 may be composed of an amorphous semiconductor material, such as, for example, amorphous silicon, amorphous germanium, or a combination thereof. In an embodiment, the passivation layer 508 may be composed of an intrinsic semiconductor (i.e. undoped semiconductor), such as, for example, intrinsic silicon or intrinsic germanium. In a preferred embodiment, the passivation layer 508 may be composed of an intrinsic amorphous semiconductor, such as, for example, intrinsic amorphous silicon or intrinsic amorphous germanium. The passivation layer 508 may be formed using a conventional deposition technique, such as, for example, MBD, atomic layer deposition (ALD), chemical vapor deposition (CVD), physical vapor deposition (PVD), plasma enhanced CVD (PECVD), pulsed laser deposition (PLD), liquid source misted chemical deposition (LSMCD), spin on deposition, or sputtering. In an embodiment, the passivation layer 508 may have a thickness ranging from approximately 2 nm to approximately 8 nm.

Figure 6:
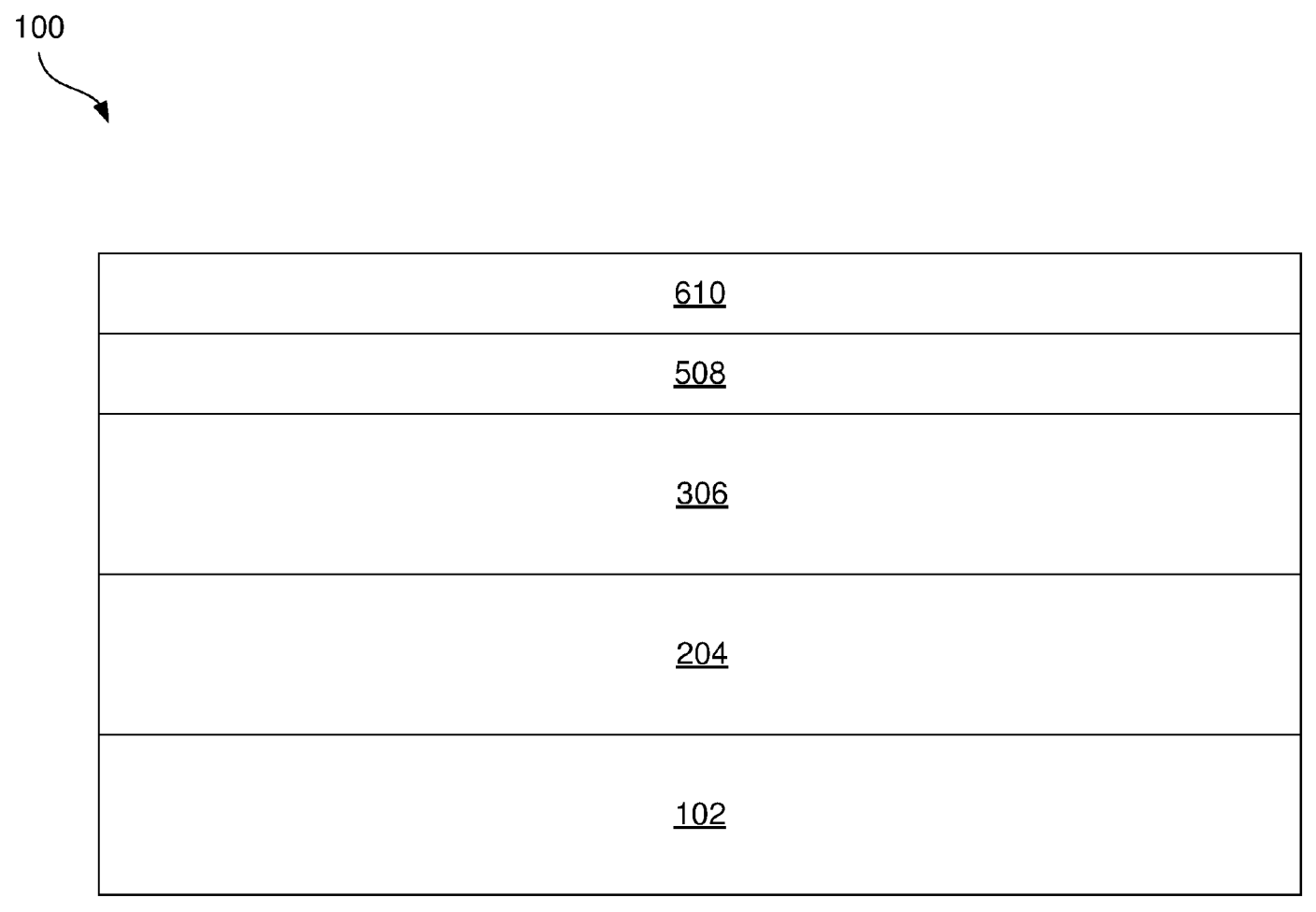

Referring now to FIG. 6, a cross section view illustrating forming an emitter layer 610 on an upper surface of the passivation layer 508 is shown. In an embodiment, the emitter layer 610 may be composed of an amorphous semiconductor material, such as, for example, amorphous silicon, amorphous germanium, or a combination thereof. The emitter layer 610 may be doped to attract minority carriers and repel majority carriers. The emitter layer 610 may have an opposite-type dopant as the back surface field layer 204. For instance, if the back surface field layer 204 contains a p-type dopant, the emitter layer 610 may contain an n-type dopant. Since the emitter layer 610 may have an opposite-type dopant as the back surface field layer 204, a photovoltaic effect may be created. In an embodiment, the emitter layer 610 may contain an n-type doping agent, such as, for example, nitrogen, phosphorus, arsenic, antimony, sulfur, or any combination thereof. The emitter layer 610 may be formed using a conventional deposition technique, such as, for example, MBD, ALD, CVD, PVD, PECVD, PLD, LSMCD, spin on deposition, or sputtering. Some conventional solar cell configurations may require metal organic chemical vapor deposition (MOCVD), such as, for example, a conventional single crystal p-type intrinsic layer n-type (PIN) solar cell. However, embodiments of the present invention may not require MOCVD to form the emitter layer 610, resulting in a simpler fabrication process.

Figure 7:
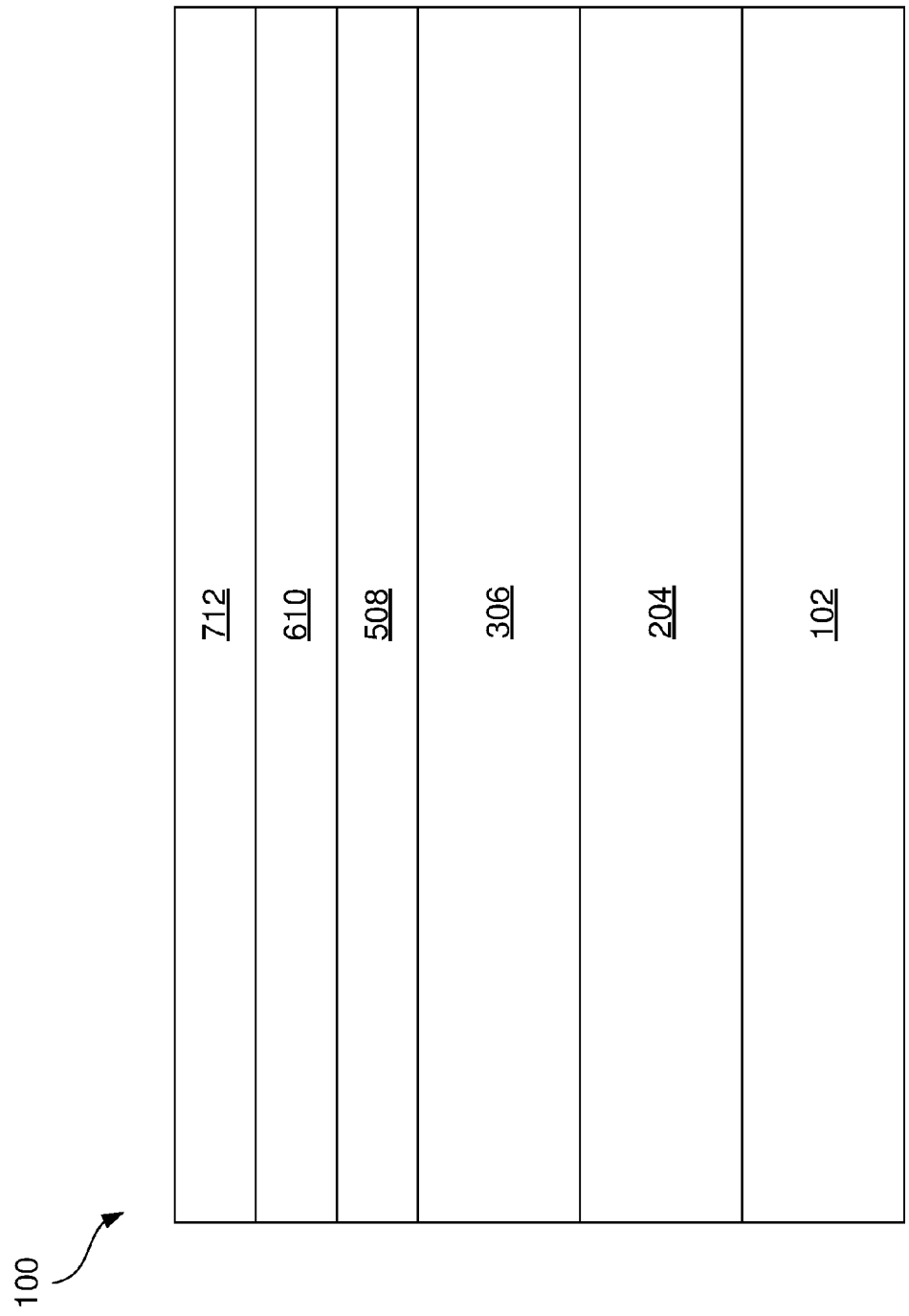
FIG. 7 is a cross section view illustrating forming a transparent electrode layer, according to an embodiment of the present invention.

Referring now to FIG. 7, a cross section view illustrating forming a transparent electrode layer 712 on an upper surface of the emitter layer 610 is shown. The transparent electrode layer 712 may be optically transparent and electrically conductive in a thin layer. The transparent electrode layer 712 may include an oxide material, such as, for example, zinc oxide, indium oxide, or any combination thereof. In an embodiment, the transparent electrode layer 712 may be doped with a metal material, such as, for example, aluminum, tin, or a combination thereof. For example, the transparent electrode layer 712 may be composed of zinc oxide and doped with aluminum. In another example, the transparent electrode layer 712 may be composed of indium oxide and doped with tin. In another embodiment, the transparent electrode layer 712 may be composed of a transparent conducting polymer, such as, for example, poly(3,4-ethylenedioxythiophene), poly(4,4-dioctylcyclopentadithiophene), or a combination thereof. In another embodiment, the transparent electrode layer 712 may be doped with poly(styrene sulfonate), iodine, 2,3-dichloro-5,6-dicyano-1,4-benzoquinone, or a combination thereof. The transparent electrode layer 712 may be formed using any suitable deposition technique known the art, including, for example, MBD, ALD, CVD, PVD, PECVD, PLD, LSMCD, spin on deposition, sputtering, or platting.

Referring now to FIG. 8, a cross section view illustrating forming a front contact layer 814 on an upper surface of the transparent electrode layer 712 is shown. The front contact layer 814 may be composed of a metal material, such as, for example, silver, copper, gold, aluminum, or any combination thereof. In a preferred embodiment, the front contact layer 814 may be composed of silver. The front contact layer 814 may be formed using any deposition process known in the art, such as, for example, screen printing, electroplating, electrophoretic deposition, underpotential deposition, chemical vapor deposition, physical vapor deposition, atomic layer deposition, or any combination thereof.

Referring now to FIG. 9, a cross section view illustrating forming a back contact layer 900 on a bottom surface of the substrate 102 is shown. The back contact layer 900 may serve as an electrical contact to the bottom surface of the substrate 102. In an embodiment, the back contact layer 900 may carry holes away from the substrate 102. The back contact layer 900 may be composed of a conductive metal, such as, for example, silver, copper, gold, aluminum, titanium gold, titanium palladium gold, or any combination thereof. In a preferred embodiment, the back contact layer 900 may be composed of titanium gold. The back contact layer 900 may be formed using any deposition process known in the art, such as, for example, electroplating, electrophoretic deposition, underpotential deposition, CVD, low pressure CVD, liquid sourced misted chemical deposition (LSMCD), PVD, ALD, pulsed laser deposition (PLD), sputtering, or any combination thereof.

Embodiments of the present invention may provide a structure and method of forming a HIT solar cell. The HIT solar cell may involve simpler fabrication processes than conventional solar cell configurations and provide substantially the same performance as conventional solar cell configurations. A conventional single crystal PIN solar cell may require MOCVD to form an emitter layer on an intrinsic passivation layer, however, embodiments of the present invention may not require MOCVD to form the emitter layer 610 on the passivation layer 508, resulting in simpler fabrication than conventional methods. Although embodiments of the present invention may involve a simpler fabrication process, they may have a lower open circuit voltage and a lower fuel factor than conventional solar cell configurations without a surface treatment. However, open circuit voltage and fuel factor may be improved by implementing the surface treatment discussed in reference to FIG. 4. Specifically, a combination of hydrogen fluoride cleaning and ammonium sulfide passivation may result in an improvement in the solar cell's open circuit voltage ranging from approximately a half bandgap to approximately a full bandgap voltage. In addition, the plasma surface treatment involving phosphine plasma, hydrogen plasma, and nitrogen trifluoride plasma may improve fill factor up to approximately 85%. Utilizing the hydrogen fluoride cleaning process, ammonium sulfide passivation, and the plasma surface treatment may improve power conversion efficiency to substantially the same level as a conventional single crystal PIN solar cell.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A heterostructure with an intrinsic thin layer (HIT) solar cell structure comprising:
   a back surface layer on an upper surface of a substrate;
   an absorber layer on an upper surface of the back surface layer;
   a sulfur monolayer on an upper surface of the absorber layer;
   a thin solid layer on an upper surface of the absorber layer, wherein the thin solid layer comprises phosphine, hydrogen, and nitrogen trifluoride;
   a passivation layer on the upper surface of the absorber layer;
   an emitter layer on the upper surface of the passivation layer;
   a transparent electrode layer on an upper surface of the emitter layer;

a front contact layer on an upper surface of the transparent electrode layer; and a back contact layer on a bottom surface of the substrate.

2. The structure of claim 1, wherein the sulfur monolayer terminates dangling bonds on the surface of the absorber layer, resulting in increased open circuit voltage ranging from a half bandgap to a full bandgap voltage.

3. The structure of claim 1, wherein the absorber layer comprises gallium arsenide, aluminum gallium arsenide, amorphous silicon, or any combination thereof.

4. The structure of claim 1, wherein the absorber layer comprises gallium arsenide.

5. The structure of claim 1, wherein the absorber layer comprises a p-type doping agent including boron, aluminum, gallium, or a combination thereof.

6. The structure of claim 1, wherein the absorber layer comprises a lighter doping than the back surface field layer.

7. The structure of claim 1, wherein the passivation layer reduces carrier recombination at a front surface of the HIT solar cell structure by reducing junction defects thereby allowing electrons to flow more freely out of the absorber layer and toward the front contact layer.

8. The structure of claim 1, wherein the passivation layer comprises amorphous silicon, amorphous germanium, or a combination thereof.

9. The structure of claim 1, wherein the passivation layer comprises an intrinsic semiconductor including intrinsic silicon or intrinsic germanium.

10. The structure of claim 1, wherein the passivation layer comprises an intrinsic amorphous semiconductor including intrinsic amorphous silicon or intrinsic amorphous germanium.

11. The structure of claim 1, wherein the passivation layer comprises a thickness ranging from approximately 2 nm to approximately 8 nm.

12. The structure of claim 1, wherein the emitter layer comprises amorphous silicon, amorphous germanium, or a combination thereof.

13. The structure of claim 1, wherein the emitter layer comprises a doping agent used to attract minority carriers and repel majority carriers.

14. The structure of claim 1, wherein the emitter layer comprises an opposite-type dopant as the back surface layer.

15. The structure of claim 1, wherein the emitter layer comprises an n-type doping agent including nitrogen, phosphorus, arsenic, antimony, sulfur, or any combination thereof.

16. The structure of claim 1, wherein the transparent electrode layer is optically transparent and electrically conductive.

17. The structure of claim 1, wherein the transparent electrode layer comprises zinc oxide, indium oxide, or any combination thereof.

18. The structure of claim 1, wherein the transparent electrode layer is doped with aluminum, tin, or a combination thereof.

19. The structure of claim 1, wherein the transparent electrode layer comprises zinc oxide and doped with aluminum.

20. The structure of claim 1, wherein the transparent electrode layer comprises indium oxide and doped with tin.

* * * * *